(12) United States Patent
Langen et al.

(10) Patent No.: US 11,508,531 B2
(45) Date of Patent: Nov. 22, 2022

(54) PHOTOVOLTAIC DEVICE AND METHOD OF MANUFACTURING THE SAME

(71) Applicant: Nederlandse Organisatie voor toegepast-natuurwetenschappelijk onderzoek TNO, 's-Gravenhage (NL)

(72) Inventors: Adrianus Petrus Langen, Breda (NL); Herbert Lifka, Eindhoven (NL); Ike Gerke De Vries, Kaatsheuvel (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 53 days.

(21) Appl. No.: 17/261,821

(22) PCT Filed: Jul. 23, 2019

(86) PCT No.: PCT/NL2019/050472
§ 371 (c)(1),
(2) Date: Jan. 20, 2021

(87) PCT Pub. No.: WO2020/022885
PCT Pub. Date: Jan. 30, 2020

(65) Prior Publication Data
US 2021/0343483 A1 Nov. 4, 2021

(30) Foreign Application Priority Data
Jul. 25, 2018 (EP) .................................... 18185515

(51) Int. Cl.
*H01G 9/20* (2006.01)
*H01G 9/00* (2006.01)
(Continued)

(52) U.S. Cl.
CPC ......... *H01G 9/2072* (2013.01); *H01G 9/0036* (2013.01); *H01G 9/2009* (2013.01);
(Continued)

(58) Field of Classification Search
CPC .. H01G 9/2072; H01G 9/0036; H01G 9/2009; H01L 27/302; H01L 51/4253;
(Continued)

(56) References Cited

U.S. PATENT DOCUMENTS 4,562,637 A * 1/1986 Kushima ................. H01L 31/18
228/180.1
2011/0266588 A1 11/2011 Gaerditz
(Continued)

FOREIGN PATENT DOCUMENTS

JP 62088371 A 4/1987

OTHER PUBLICATIONS

European Patent Office, International Search Report in corresponding International Application No. PCT/NL2019/050472, dated Oct. 22, 2019 (2 pages).

*Primary Examiner* — Devina Pillay
(74) *Attorney, Agent, or Firm* — Leydig, Voit & Mayer, Ltd.

(57) ABSTRACT

A photovoltaic device (10) is provided that comprises serially arranged photovoltaic device cells (10A, 10B). Each cell having a transparent electrode layer region electrical conductors (121A, . . . , 124A) forming an electric contact with the transparent electrode layer region, a photo-voltaic stack portion (14A, 14B) that extends over the transparent electrode region (11A, 11B) and over an insulated portion of the electrical conductors, a further electrode region (15A, 5B) that extends over the photovoltaic stack portion (14A, 14B). A further electrode region (15A) of a photovoltaic device cell (10A) extends over electric contacts formed by exposed ends (12B1) of the electrical conductors of a subsequent photovoltaic device cell (10B).

13 Claims, 10 Drawing Sheets (51) Int. Cl.
  *H01L 27/30* (2006.01)
  *H01L 51/42* (2006.01)
  *H01L 51/44* (2006.01)
  *H01L 31/18* (2006.01)
  *H01L 31/05* (2014.01)
  *H01L 31/0465* (2014.01)
  *H01L 31/0463* (2014.01)

(52) U.S. Cl.
  CPC ........ *H01L 27/302* (2013.01); *H01L 31/1884* (2013.01); *H01L 51/4253* (2013.01); *H01L 51/4293* (2013.01); *H01L 51/441* (2013.01); *H01L 51/442* (2013.01); *H01L 51/445* (2013.01); *H01L 31/0463* (2014.12); *H01L 31/0465* (2014.12); *H01L 31/0504* (2013.01)

(58) Field of Classification Search
  CPC . H01L 51/4293; H01L 51/442; H01L 51/441; H01L 51/445; H01L 31/0465; H01L 31/0463; H01L 31/0504; Y02E 10/542; Y02E 10/549; Y02P 70/50
  See application file for complete search history.

(56) References Cited

U.S. PATENT DOCUMENTS

2018/0138343 A1* 5/2018 Lee ..................... H01L 31/0508
2020/0028014 A1* 1/2020 Fessehatzion .......... H01L 31/18

* cited by examiner

PHOTOVOLTAIC DEVICE AND METHOD OF MANUFACTURING THE SAME

CROSS-REFERENCE TO RELATED APPLICATIONS

This patent application is a U.S. National Phase of PCT International Application No. PCT/NL2019/050472, filed Jul. 23, 2019, which claims priority to European Application No. 18185515.6, filed Jul. 25, 2018, which are both expressly incorporated by reference in their entireties, including any references contained therein.

BACKGROUND OF THE INVENTION

Field of the Invention

The present invention relates to a photovoltaic device.
The present invention further relates to a method of manufacturing the same.

Related Art

A photovoltaic cell typically comprises a photovoltaic layer arranged between a pair of electrodes. The photovoltaic layer may be formed as a stack of sub-layers. At least one of the electrodes should be substantially transparent to enable solar radiation to reach the photovoltaic layer. The substantially transparent electrode is usually shunted with a patterned layer of an electrically conducting material, e.g. a metal. The electrically conducting material is usually non-transparent, but the patterned layer, forms openings that allows solar radiation to reach the photovoltaic layer. Photovoltaic devices typically comprise a plurality of such device cells in a serial arrangement. Therewith operation at a relatively high voltage and a low current is enabled, can be evoked so as to reduce ohmic losses. Ohmic losses not only directly impair the efficiency. Also indirectly the efficiency is impaired therewith as the heat generated as a result of the dissipated energy causes a rise in temperature and therewith negatively affects the photovoltaic conversion efficiency. The typical solutions to create an electrical series connection between the cells is to apply the functional layers on top of each other and remove material selectively with a P2 laser scribe in machine direction along the total length of the cells. The bottom electrode is exposed and when the top electrode material is applied, the top and bottom electrode are electrical series connected. The electrical series connection is along the total length of the cells. In particular in photovoltaic devices that employ a perovskites as the photovoltaic material it is a disadvantage that the removed material in this process become airborne and contaminate the substrate and surroundings.

SUMMARY OF THE INVENTION

It is an object to provide an improved method that at least mitigates this disadvantage.
It is a further object to provide an improved photovoltaic device having a design that enables manufacturing with the improved method.
It is noted that the wording layer used below refers to an element having lateral dimensions of a size that are substantially greater than a thickness dimension. A layer may comprise one or more sub-layers. For example a photovoltaic layer or a lateral portion thereof may have in addition to a conversion layer that actually creates charge carriers upon receipt of photon radiation, further comprise a pair of charge carrier sublayers, between which the conversion layer is sandwiched. In its turn the conversion layer may comprise a positively doped and negatively doped sub-layer. Also a combination of conversion sub layers that each have a specific sensitivity for a proper wavelength range may be provided. As another example, an electrode layer may comprise various electrically conducting layers. For example a relative thick aluminum sub layer e.g. having a thickness of 100 to a few 100 nm, e.g. 190 nm, and which is sandwiched between a pair of relatively thin nickel sub layers, each having a thickness of a few nm, e.g. 5 nm.

In accordance therewith a method is provided as claimed in claim 1. The claimed method comprises the following steps:

Providing on a substrate a transparent electrode layer comprising at least a first pair of a first and a second transparent electrode layer region, which are distinct from each other in a succession direction. The succession direction may for example correspond to a direction in which a substrate is transported. The transparent electrode layer may be of a suitably transparent electrically conducting material, for example a metal oxide like ITO or an organic transparent conducting material. A transparent electrode layer may be provided on a substrate by a continuous deposition method and may subsequently be partitioned in the at least a first pair of a first and a second transparent electrode layer region, for example by a laser ablation step. Alternatively, the transparent electrically conductive material may be directly applied as the a first pair of a first and a second transparent electrode layer region, for example using a printing method like inkjet printing or using a slot-die coating process which is periodically interrupted.

Forming a respective set of one or more electrical conductors on a surface of each transparent electrode region, the electrical conductors having a first main surface forming an electric contact with their respective transparent electrode region, and having a second main surface opposite said main surface, wherein the second main surface has an exposed end-portion forming a further electric contact in a direction away from the succession direction, a remaining portion of the second main surface being electrically insulated.

Depositing respective photo-voltaic layer portions, each photovoltaic layer portion extending over the respective transparent electrode region and over the insulated portion of the one or more conductors of the respective set. As noted above a photo-voltaic layer (portion) may comprise a plurality of sub-layer (portions), examples of which are presented below.

Depositing respective further electrode regions that extend over the respective photovoltaic layer regions, wherein the further electrode region that extends over the first photovoltaic layer region further extends over the electric contacts formed by the exposed ends of the set of one or more electrical conductors that are formed on the second transparent electrode layer region.

In this way a photovoltaic device is obtained having the a first and a second photovoltaic cell arranged in series, wherein the first and the second photovoltaic cell are formed on the first and the second transparent electrode layer region respectively. The method obviates the step of an ablation step, and therewith avoids that materials become airborne and contaminate the substrate and surroundings. In practice a photovoltaic device having a larger number of photovoltaic cells may be formed, with a second pair, a third pair, ..., an $n^{th}$ pair of photovoltaic cells. Therein the second pair comprises the second photovoltaic cell and a third photovoltaic cell, wherein the mutual arrangement between the second photovoltaic cell and the third photovoltaic cell is analogous to the mutually arrangement of the first and the second photovoltaic cell. The same applies to the third pair comprising the third photovoltaic cell and a fourth photovoltaic cell etc.

In an embodiment, forming a respective set comprises a first sub-step of depositing a precursor for an electrically conductive material on the surface of the transparent electrode, an intermediate sub-step of curing the precursor to form the set of one or more electrical conductors having a first main surface forming an electric contact with their respective transparent electrode region, and having a second main surface opposite said main surface and a second sub-step of depositing an electrically insulating material over the remaining portion of the second main surface therewith laving exposed the end-portion to form the further electric contact.

In another embodiment, forming a respective set comprises a first sub-step of depositing an electrically conducting material on the surface of the transparent electrode to form the set of one or more electrical conductors having a first main surface forming an electric contact with their respective first, transparent electrode region, and having a second main surface opposite said main surface, and a second sub-step of depositing a respective electrically insulating layer over the remaining portion of the second main surface of each of the one or more electrical conductors therewith leaving exposed their end-portions. The electrically insulating layer can laterally extend beyond the areas where the electrically conducting material was deposited.

In an embodiment the electrical conductors in a set of electrical conductors of a photovoltaic cell are aligned with the electrical conductors in a set of electrical conductors of an immediately succeeding photovoltaic cell.

In another embodiment, the set of one or more electrical conductors of the at least a first photovoltaic device cell extend in the succession direction beyond the exposed ends of the set of one or more electrical conductors of the at least a second photovoltaic device cell, each of the one or more electrical conductors of the at least a first photovoltaic device cell being displaced in a direction transverse to the succession direction with respect to each of the one or more electrical conductors of the at least a second photovoltaic device cell. In this way a gap between subsequent photovoltaic device cells can be reduced, which is favorable for an efficiency of the photovoltaic device.

In an embodiment, the transparent electrode layer regions of the first and the second photovoltaic device cell have a jagged boundary wherein end portions of the transparent electrode layer regions of the first and the second photovoltaic device cell are mutually interdigitated and wherein the one or more electrical conductors extend with their exposed end portions over the end portions of the transparent electrode layer regions the second photovoltaic device cell. In this way it is achieved that the subsequent photo-voltaic layer regions and further electrode layer regions can have a linear boundary which facilitates their deposition.

In accordance with the above-mentioned object, also a photovoltaic device is provided as claimed in claim 9.

The claimed photo-voltaic device comprises at least a first pair of a first photovoltaic device cell and a second photovoltaic device cell that succeeds the first photovoltaic device cell in a succession direction and that is electrically connected in series therewith. A substrate for the photo-voltaic device may for example be a resin base material. Such resin base materials preferably include polyethylene terephthalate (PET), polyethylene naphthalate (PEN), polyimide (PI), polyetherimide (PEI), polyethersulfone (PES), polysulfone (PSF), polyphenylene sulfide (PPS), polyether ether ketone (PEEK), polyarylate (PAR), and polyamide-imide (PM). Other resin materials include polycycloolefin resin, acrylic resin, polystyrene, ABS, polyethylene, polypropylene, polyamide resin, polyvinyl chloride resin, polycarbonate resin, polyphenyleneether resin and cellulose resin, etc. Dependent on the application a thickness of the substrate may be selected in the range of a relatively small value e.g. 50 micron and a relatively large value, e.g. a few mm or more.

Each photovoltaic device cell comprises a respective transparent electrode layer region, a respective set of one or more electrical conductors, a respective photo-voltaic stack portion and a respective further electrode region.

Examples of transparent electrically conductive materials are organic materials such as polyaniline, polythiophene, polypyrrole or doped polymers. Apart from organic materials, various inorganic transparent, electrically conducting materials are available like ITO (Indium Tin Oxide), IZO (Indium Zinc Oxide), ATO (Antimony Tin Oxide), or Tin Oxide can be used. Other metal oxides can work, including but not limited to Nickel-Tungsten-Oxide, Indium doped Zinc Oxide, Magnesium-Indium-Oxide. The transparent electrically conductive electrode layer may have a thickness in the range of a few tens of nm to a few hundreds of nm, for example in a range between 100 and 200 nm, for example about 120 nm.

Also additional layers may be present, for example as a barrier for moisture and oxygen, or for mechanical reinforcement for blocking UV-radiation and the like.

The respective transparent electrode layer regions are distinct from each other in the succession direction.

The respective set of one or more electrical conductors is arranged on a surface of each transparent electrode region. The electrical conductors have a first main surface forming an electric contact with their respective transparent electrode region, and have a second main surface opposite said main surface. The second main surface has an exposed end-portion forming a further electric contact in a direction away from the succession direction, and a remaining portion of the second main surface is electrically insulated, The respective photo-voltaic stack portions extending over the respective transparent electrode region and over the insulated portion of the one or more conductors of the respective set. Perovskite materials are an important class of materials for use as a conversion sub layer, as these materials can be processed at relatively low temperatures, and yet have a conversion efficiency that comes close to that achieved with silicon based photo-voltaic devices. In an embodiment the photo-electric conversion layer is provided of a perovskite material. Perovskite materials typical have a crystal structure of $ABX_3$, wherein A is an organic cation as methylammonium $(CH_3NH_3)+$, B is an inorganic cation, usually lead (II) $(Pb^{2+})$, and X is a halogen atom such as iodine (I—), chlorine (Cl—) or bromine (Br—). Perovskite materials are particularly advantageous in that they can be processed relatively easily and in that their bandgap can be set to a desired value by a proper choice of the halide content. A typical example is methylammonium lead trihalide $(CH_3NH_3PbX_3)$, with an optical bandgap between 1.5 and 2.3 eV depending on halide content. Another more complex structure example is Cesium-formamidinum lead trihalide $(Cs_{0.05}(H_2NCHNH_2)_{0.95}PbI_{2.85}Br_{0.15})$ having a bandgap between 1.5 and 2.2 eV. Other metals such as tin may replace the role of Pb in perovskite materials. An example thereof is $CH_3NH_3SnI_3$. Also combinations of Sn with Pb perovskites having a wider bandgap in the range of 1.2 to 2.2 eV are possible. Although perovskite materials are preferred for the reasons specified above, also other materials are suitable, for example copper indium gallium selenide (CIGS).

A noted above, a conversion sub layer may be sandwiched between a hole-transport sub layer and an electron transport sub layer. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting molecules and polymers can be used. Typical examples for this purpose are metal oxides, like nickeloxide, and other compounds, like MoSe. In an embodiment a hole transport sub layer, may have a thickness in the range of 10 to 200 nm. An electron transport sub layer may be formed of a metal oxide, like $TiO_2$, $SnO_2$, $ZrO_2$ and $ZnO:S$. The electron transport sub layer may have a thickness in the range of a few nm, e.g. 5 nm to a few tens of nm.

The respective further electrode region extends over the respective photovoltaic stack portion. It is not necessary that the further electrode regions are transparent, as already a transparent electrode is present at the side of the substrate. Therewith the further electrode can have a relatively large thickness so that no concessions need to be made in regard to the conductivity. The respective further electrode may for example be formed of a layer of suitably conductive material, like aluminium, silver or copper. Also the further electrode layer, being partitioned into further electrode regions, may be provided as a combination of sub layers, e.g. a relative thick main sub layer of an above-mentioned suitably conductive material, e.g. having a thickness of 100 to a few 100 nm or more and a relatively thin interface sub layer at one or both faces of the main sub layer, e.g. a sub layer of a few nm of Mo or Ni. In addition the respective further electrode region of the at least a first photovoltaic device cell extends over the electric contacts formed by the exposed ends of the set of one or more electrical conductors of the at least a second photovoltaic device cell.

BRIEF DESCRIPTION OF THE DRAWINGS

These and other aspects are described in more detail with reference to the drawing. Therein:

FIG. 3A-3C schematically illustrate aspects of a second embodiment of the method as claimed.

FIG. 4A-4E schematically illustrate aspects of a third embodiment of the method as claimed.

DETAILED DESCRIPTION OF EMBODIMENTS

Like reference symbols in the various drawings indicate like elements unless otherwise indicated.

Figure 1A:
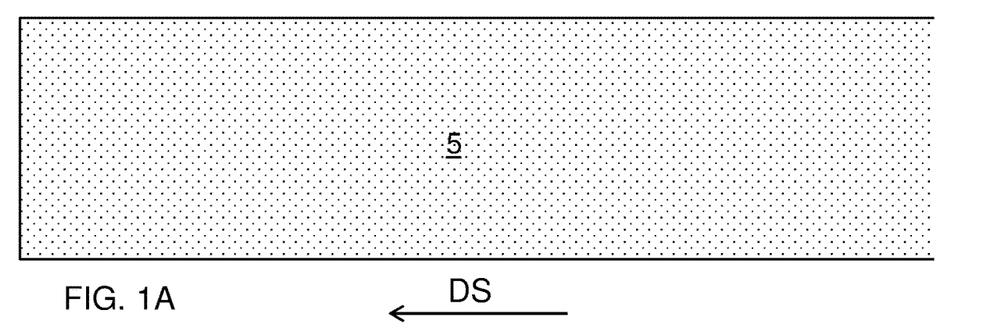
FIG. 1A-1H schematically shows a first embodiment of the method as claimed.

FIG. 1A-1H illustrate a method of manufacturing a photovoltaic device. FIG. 1A shows a substrate 5 on which the device is manufactured. Depending on the application the substrate 5 may be a rigid substrate, like glass or a flexible substrate like a polymer, e.g. PET or PEN.

Figure 1B:
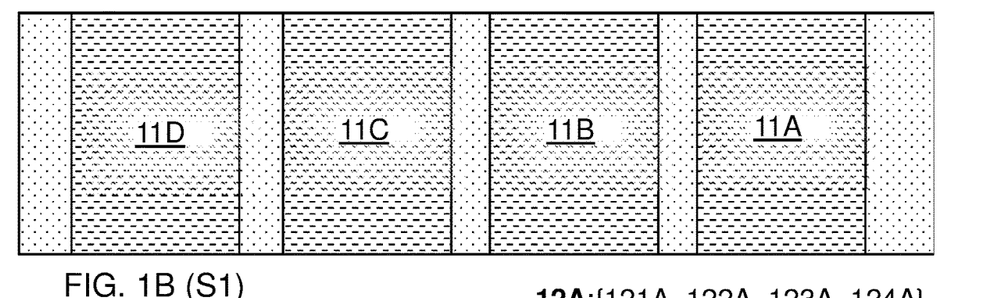

In a first step (S1) respective transparent electrode layer regions 11A, . . . , 11D are deposited, which are distinct from each other in a succession direction DS. The substrate 5 may for example be transported in transport direction opposite the succession direction and a deposition device, e.g. a printer or a coater, e.g. a slot-die coater may deposited a material forming the transparent electrode layer, while regular interrupting the interruption process to obtain the distinct regions 11A, . . . , 11D.

Figure 1C:
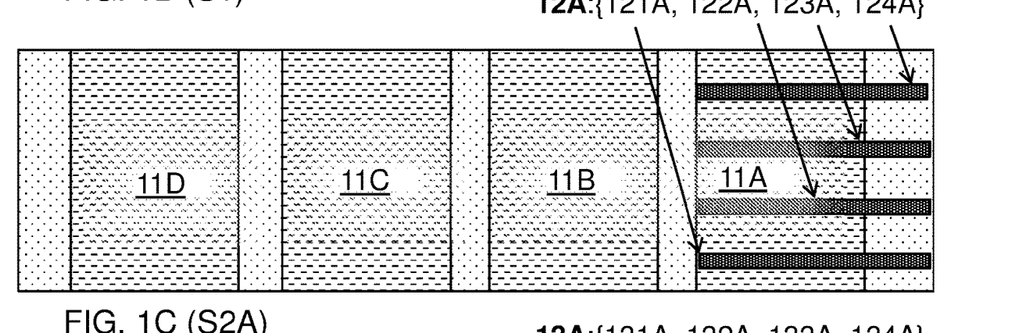
Figure 1D:
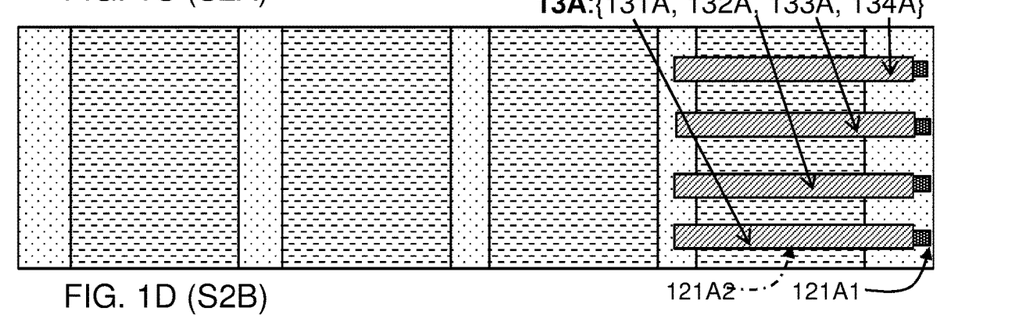

In a second step (S2A, S2B) a respective set 12A of one or more electrical conductors 121A, . . . , 124A is formed on a surface of each transparent electrode region. In this example, a plurality, here 4 electrical conductors are formed. In some embodiments the respective set may only have a single conductor, for example in applications wherein the substrate has a relatively small width (defined as the dimension transverse to the succession direction). The electrical conductors 121A, . . . , 124A may have a length in the order of a few cm to tens of cm, for example about 25 cm. The electrical conductors may be arranged with a pitch in the range of a few mm to about a few tens of mm, for example with a pitch of 4 to 10 mm, for example with a pitch of about 6 mm. The one or more electrical conductors may be part of a grid, e.g. a grid that further has one or more transvers electrical conductors, i.e. extending in a direction aligned with the plane of the substrate, but transverse to the succession direction. The electrical conductors are preferably relatively narrow, e.g. in the range of 50 to 200 micron, so that they are not readily visible, or at least do not absorb too much solar radiation. The electrical conductors may for example be obtained by electroplating silver or copper, although also other deposition methods like printing are suitable.

The electrical conductors 121A, . . . , 124A have a first main surface that forms an electric contact with its corresponding transparent electrode region here region 11A. The electrical conductors 121A, . . . , 124A have a second main surface opposite the first main surface. The second main surface has an exposed end-portion, for example the exposed end-portion 121A1 of electrical conductor 121A that forms a further electric contact in a direction away from the succession direction. A remaining portion, see for example remaining portion 121A2 of the second main surface of electrical conductor 121A is electrically insulated. The electrical conductors may for example be deposited in a first substep (S2A) of the second step and the remaining portion of their second main surface may be electrically insulated in a second substep (S2B) of the second step. The first substep S2A may for example involve an electroplating process. However also other deposition methods are applicable. For example the deposition may take place by a printing step, for example by inkjet printing. In an embodiment thereof a precursor is printed in the pattern to be formed by the electrical conductors and subsequently the printed precursor pattern is cured. Any deposition method may then be used in step S2B to deposit an insulating material over the remaining portion of the second main surface of the electrical conductors.

Figure 1E:
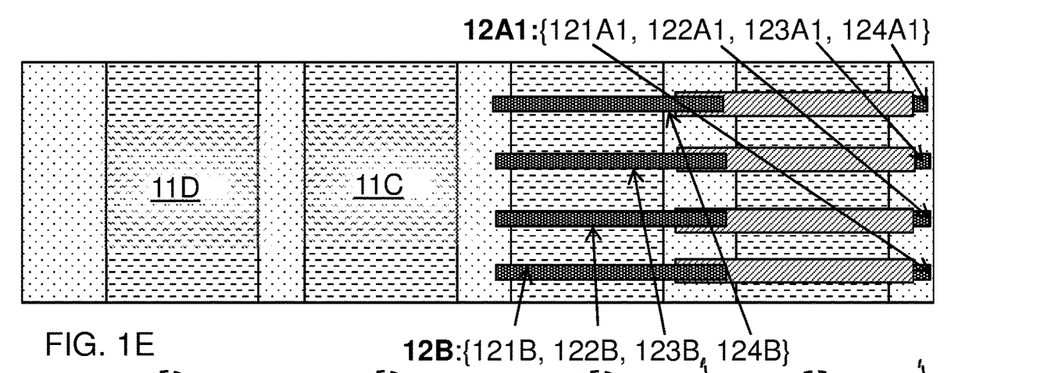

As shown in FIG. 1E, then a second set 12B of electrical conductors 121B, . . . , 124B are deposited over a second transparent electrode region 11B. The second set of electrical conductors extend partly over the insulating material that was deposited over the remaining portion 121A2 of the second main surface, of the electrical conductors of the first set 12A. Similar to the first set 12A, a remaining portion of the second main surface of the second set 12B of electrical conductors is insulated.

Figure 1F:
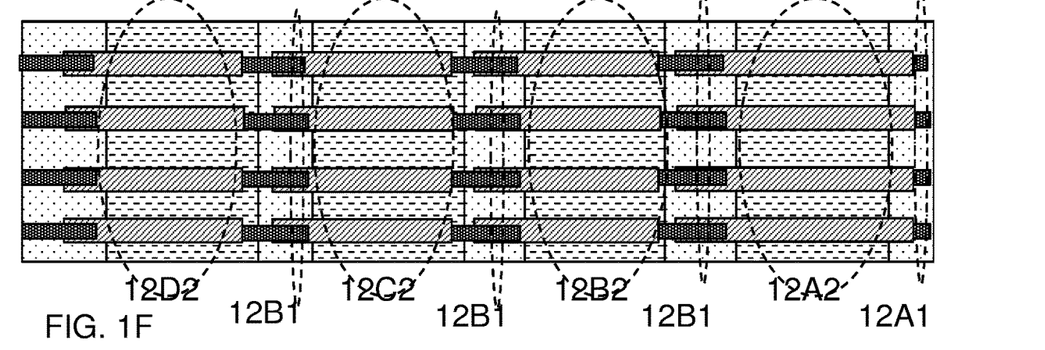

As shown in FIG. 1F, this process is repeated until all transparent electrode regions 11A, . . . , 11D are provided with a set of electrical conductors as described in detail for the first set 12A of electrical conductors.

Figure 1G:
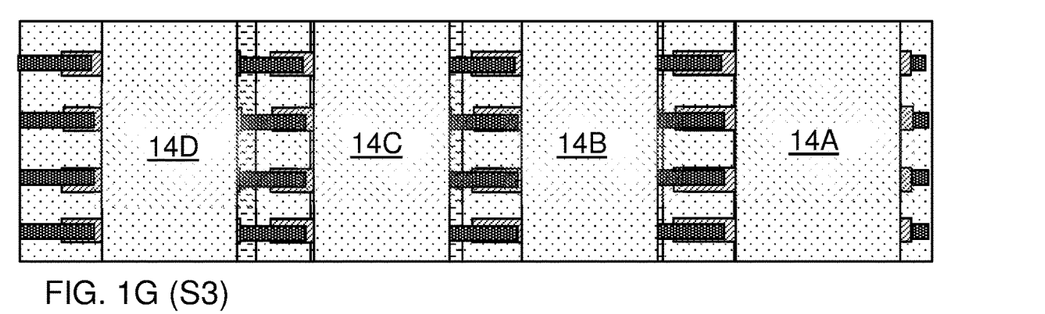

In a next step S3, a plurality of photo-voltaic layer portions 14A, . . . , 14D is deposited. Each of the photo-voltaic layer portions extending over a proper transparent electrode region 11A, . . . , 11D and over the insulated portion of the one or more conductors of the corresponding set. As noted, a layer portion may comprise a plurality of stacked sub-layer portions. For example photo-voltaic layer portion 14A, . . . , 14D, each may be a stack of sub-layers. These may be deposited sequentially, but alternatively a multilayer deposition technique may be applied, for example a multilayer coating technique. Instead of postponing step S3 until all transparent electrode regions 11A, . . . , 11D are provided with a set of electrical conductors, it is alternatively possible to deposit a photo-voltaic layer portion each time a set of partially insulated electrical conductors is applied. For example photo-voltaic layer portion 14A may be deposited directly after completion of step S2B, shown in FIG. 1D.

Figure 1H:
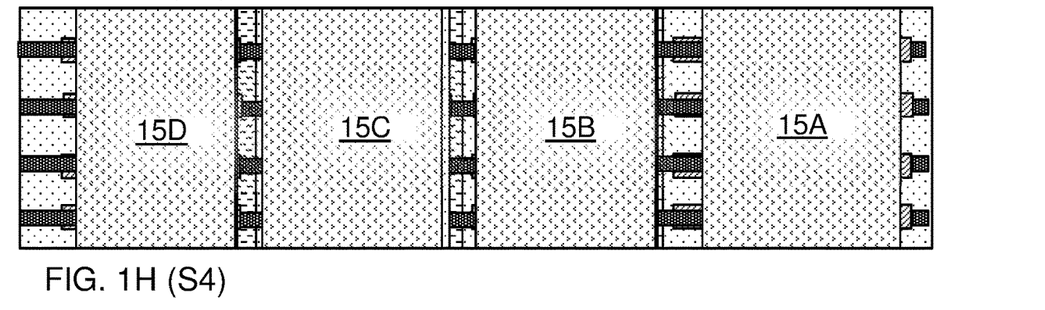

In a subsequent step S4 further electrode regions 15A, . . . , 15D are deposited. Each thereof extends over a proper photovoltaic layer region 14A, . . . , 14D. The further electrode region 15A also extends over the electric contacts formed by the exposed ends of the set 12B of one or more electrical conductors 121B, 122B, 123B, 124B that are formed on the second transparent electrode layer region 11B. Therewith a pair of a first and a second serially interconnected photovoltaic device cells 10A, 10B is formed that succeed each other in the succession direction. Similarly, it is achieved that a pair comprising the second and a third serially interconnected photovoltaic device cells 10B, 10C is formed and that a pair comprising the third and a fourth serially interconnected photovoltaic device cells 10C, 10D is formed. Instead of postponing step S4 until all photo-voltaic layer portions 14A, . . . , 14D are deposited, it is alternatively possible to deposit a further electrode region e.g. 15A once the corresponding photo-voltaic layer portion, here 14A is present.

Therewith FIG. 1H shows an example of a photovoltaic device 10 comprising at least a first pair 10A, 10B of a first photovoltaic device cell 10A and a second photovoltaic device cell 10B that succeeds the first photovoltaic device cell 10A in a succession direction DS and that is electrically connected in series therewith. Each photovoltaic device cell 10A, . . . , 10D comprises a respective transparent electrode layer region 11A, . . . , 11D (See FIG. 1B), a respective set of one or more electrical conductors (See FIG. 1F), a respective photo-voltaic stack portion (See FIG. 1G) and a respective further electrode region (See FIG. 1I1).

As shown in FIG. 1B, the transparent electrode layer regions 11A, 11B, etc. are distinct from each other in the succession direction DS.

As shown in FIG. 1F a respective set 12A, 12B of one or more electrical conductors 121A, . . . 124A is arranged on a surface of each transparent electrode region. The electrical conductors have a first main surface forming an electric contact with their corresponding transparent electrode region. For example as shown in FIG. 1D the electrical conductors of the first set 12A, being deposited on the first transparent electrode region 11A, are electrically connected therewith. Opposite this first main surface that contacts the surface of their proper transparent electrode region 11A the electrical conductors have a second main surface. The second main surface has an exposed end-portion (e.g. 121A1 see FIG. 1D) that forms a further electric contact in a direction away from the succession direction. A remaining portion 121A2 of the second main surface is electrically insulated.

Each of the photovoltaic device cells has a proper photovoltaic stack portion (14A, 14B, 14C, 14D see FIG. 1G). Each photovoltaic stack portion extends over the transparent electrode region (11A,11B) of its proper photovoltaic device cell and over the insulated portion of the one or more electrical conductors arranged on that transparent electrode region.

Each of the photovoltaic device cells has a proper further electrode region (15A, 15B) that extends over its photovoltaic stack portion (14A,14B). The proper further electrode region (15A) also extends over the electric contacts formed by the exposed ends (12B1) of the set (12B) of one or more electrical conductors of the succeeding photovoltaic device cell (10B) if present.

In an embodiment the photovoltaic device is provided on a polymer substrate, e.g. a PET substrate, having a thickness in the range of a relatively small value e.g. 50 micron and a relatively large value, e.g. a few mm or more, for example having thickness of about 125 micron. The transparent electrically conductive layer, which is partitioned into transparent electrode layer portions is of indium tin oxide (ITO) and has a thickness of about 120 nm.

In an exemplary embodiment, the resistance of electroplated electrical conductors 121A, . . . , 124A dimensioned 100 μm wide, 5 μm high and ¼ meter long is approx. 8Ω.

At 1 kW of solar power, a square meter of 20% efficient solar cells renders 200 W/square meter. The typical cell voltage is 1.1V and gridline length of ¼ meter with a pitch of 6 mm electrical conductors (166 per meter). Therewith the electric current conducted by the electrical conductors would be in the order of 0.27 A, which is acceptable. The layer of insulation material that covers the electrical conductors 121A, . . . , 124A, except for their exposed ends, slightly extends laterally with respect to these conductors, for example with a few tens of micron at each side of these conductors. So in this example, the electrical conductors 121A, . . . , 124A dimensioned 100 μm wide may be covered with 150 μm wide dielectric. The used surface area is 166 multiplied by 150 μm is 0.025 m2 area, so the residual active area (aperture) is 97.5%. The surface area used to make 4 series connections in machine direction is approx. 2% (5 mm per series connection). The final aperture which remains after subtraction of the area occupied by the electrical conductors and the area required for the series connection is 97.5%×98.0%=95.5% This aperture is equal or better as compared to current solar cell modules (95%) wherein a P2 laser scribe is used for partitioning.

Further steps may take place, for example to provide the photovoltaic device with a barrier layer or a scratch resistant layer, or to apply electrical terminals.

The photovoltaic layer being partitioned into photovoltaic layer portions may comprise a stack of a hole transport sub layer, a conversion sub layer of a perovskite material and an electron transport sub layer.

In the embodiment shown the hole transport sub layer is formed by a nickeloxide layer having a thickness of about 50 nm. The conversion sub layer of a perovskite material is formed of Cesium-formamidinum lead trihalide (Cs0.05 (H2NCHNH2)0.95PbI2.85Br0.15) and has a thickness of about 100 nm.

The electron transport sub layer is a TiO2 layer having thickness of about 15 nm.

In an example, the further electrode layer, which is partitioned into further electrode layer portions may comprise an aluminum layer having a thickness of about 190 nm and a pair of nickel sub layers, each having a thickness of a few nm, e.g. 5 nm, between which the aluminum layer is sandwiched.

Figure 2:
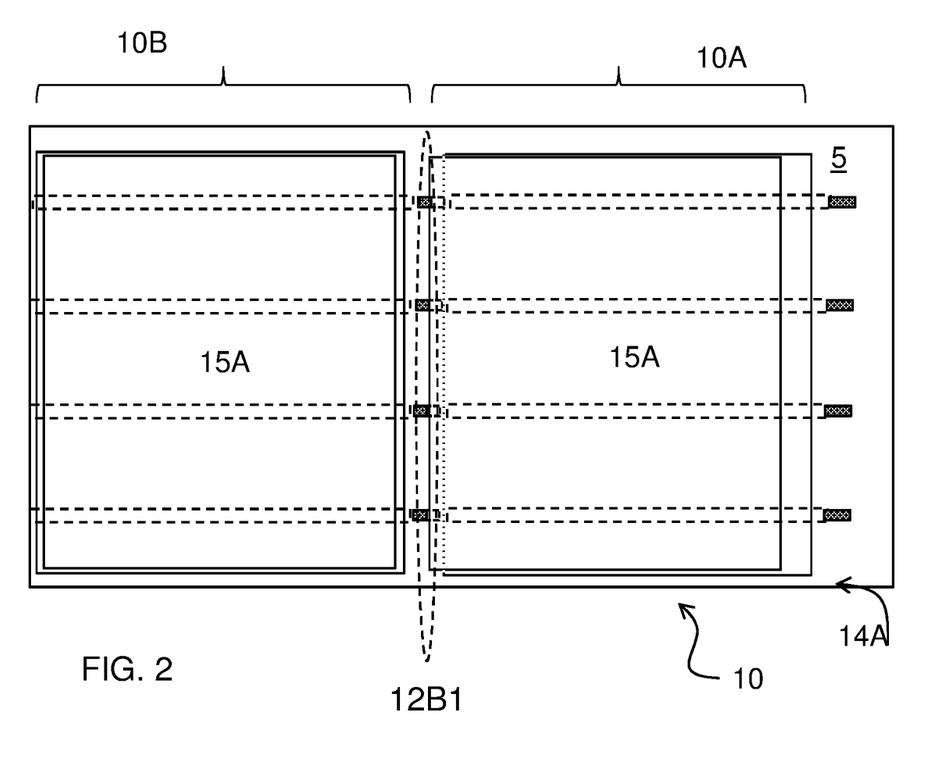
FIG. 2 shows an embodiment of a photovoltaic device as claimed.

FIG. 2 shows another view of a product obtained with a method according to steps 1A-1H.

Figure 3A:
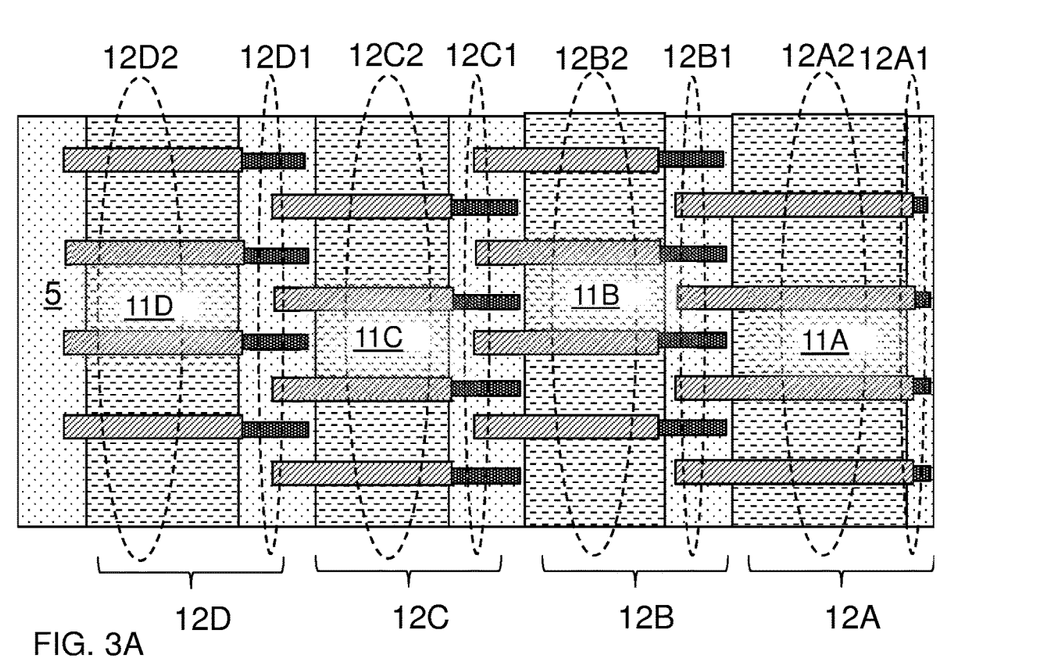

FIG. 3A illustrates an aspect of an alternative embodiment of the method. Subsequent to step S1, wherein the transparent electrode regions 11A, . . . , 11D are deposited on the substrate, the sets 12A, 12B, 12C, 12D of one or more electrical conductors are deposited in a manner, wherein each of the sets is displaced in a direction transverse to the succession direction with respect to its neighboring set(s). For example it can be seen in FIG. 3A, that each of the one or more electrical conductors of set 12A is displaced in a direction transverse to the succession direction with respect to each of the one or more electrical conductors of set 12B. Also, the set 12A of one or more electrical conductors of the at least a first photovoltaic device cell 10A extend in the succession direction beyond the exposed ends 12B1 of the set 12B of one or more electrical conductors of the at least a second photovoltaic device cell 10B. The same applies for the spatial relationship between sets 12B, 12C and the spatial relationship between sets 12C, 12D.

Figure 3B:
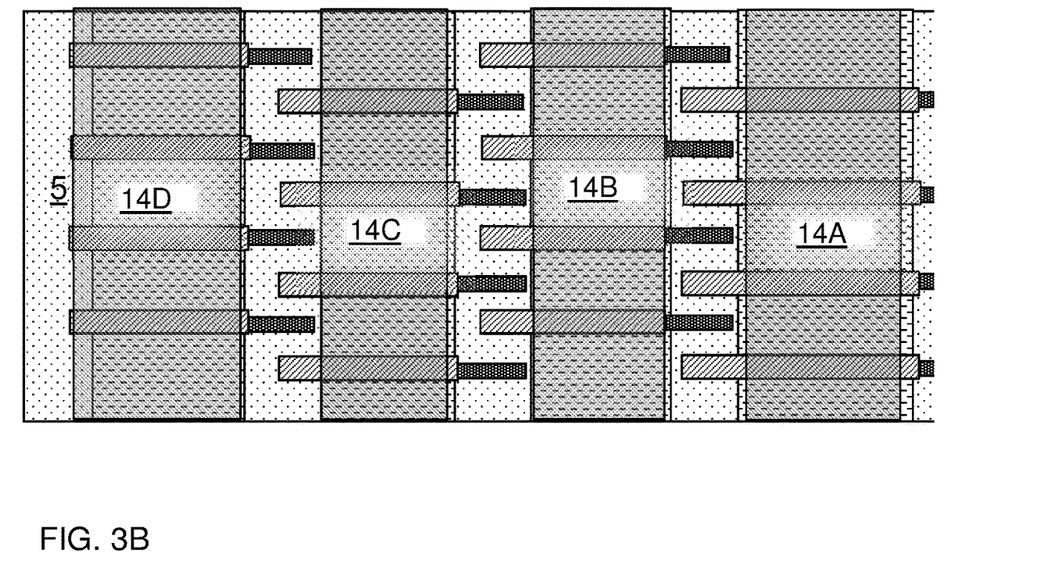
Figure 3C:
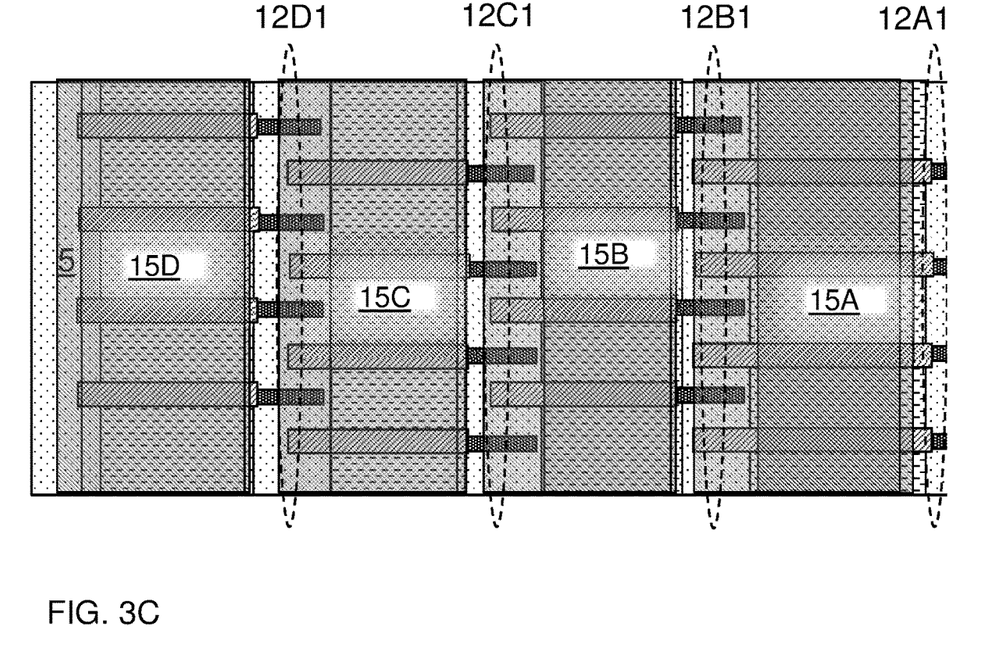
FIG. 3C shows an embodiment of a photovoltaic device as claimed which is obtained in the last step of the second embodiment of the method.

As in the embodiment described with reference to FIG. 1A-111, a plurality of photo-voltaic layer portions 14A, . . . , 14D is deposited, as shown in FIG. 3B. Also further electrode regions 15A, . . . , 15D are deposited as shown in FIG. 3C. Each thereof extends over a proper photovoltaic layer region 14A, . . . , 14D. Furthermore, further electrode regions 15A, 15B, 15C of a photovoltaic cell having a successor extend over the electric contacts formed by the exposed ends 12B1, 12C1, 12D1 of the set of one or more electrical conductors proper to that successor. The embodiment as shown in FIG. 3A-3C is advantageous in that all sets 12A, 12B, 12C, 12D of electrical conductors can be applied first, before all insulating layers are applied that cover the remaining, non-exposed parts of the electrical conductors.

Figure 4A:
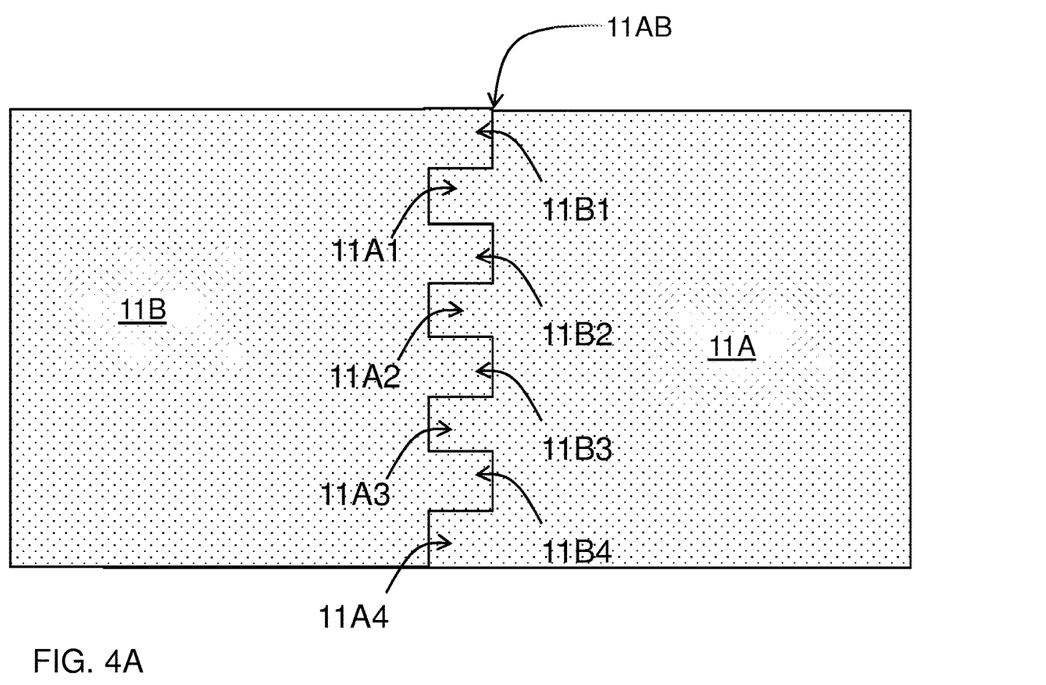

A still further embodiment of the method as claimed is shown in FIG. 4A-4E. As shown in FIG. 4A, in this method, the transparent electrode layer regions 11A, 11B of the first and the second photovoltaic device cell 10A, 10B are provided with a jagged boundary 11AB. End portions 11B1 of the transparent electrode layer regions 11A, 11B of the first and the second photovoltaic device cell 10A, 10B are mutually interdigitated. This may be achieved by a patterning deposition method, e.g. by a printing method. Alternatively, this may be achieved by a blanketwise deposition method succeeded by step wherein the transparent electrode layer is partitioned into regions by patterning step wherein material of the transparent electrode layer is removed at the boundary 11AB. This may take place by laser ablation.

Figure 4B:
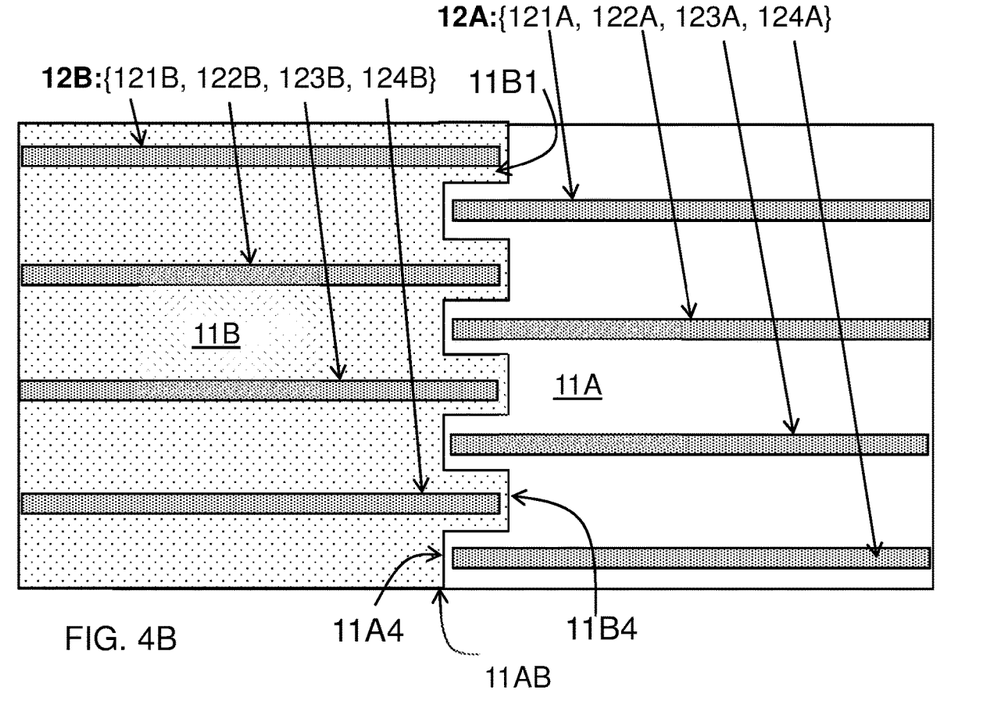

As furthermore shown in FIG. 4B, the one or more electrical conductors 121B, . . . 124B are deposited such that they extend with their exposed end portions 121B1, . . . 124B1 over the end portions 11B1 of the transparent electrode layer regions 11B of the second photovoltaic device cell 10B.

Figure 4C:
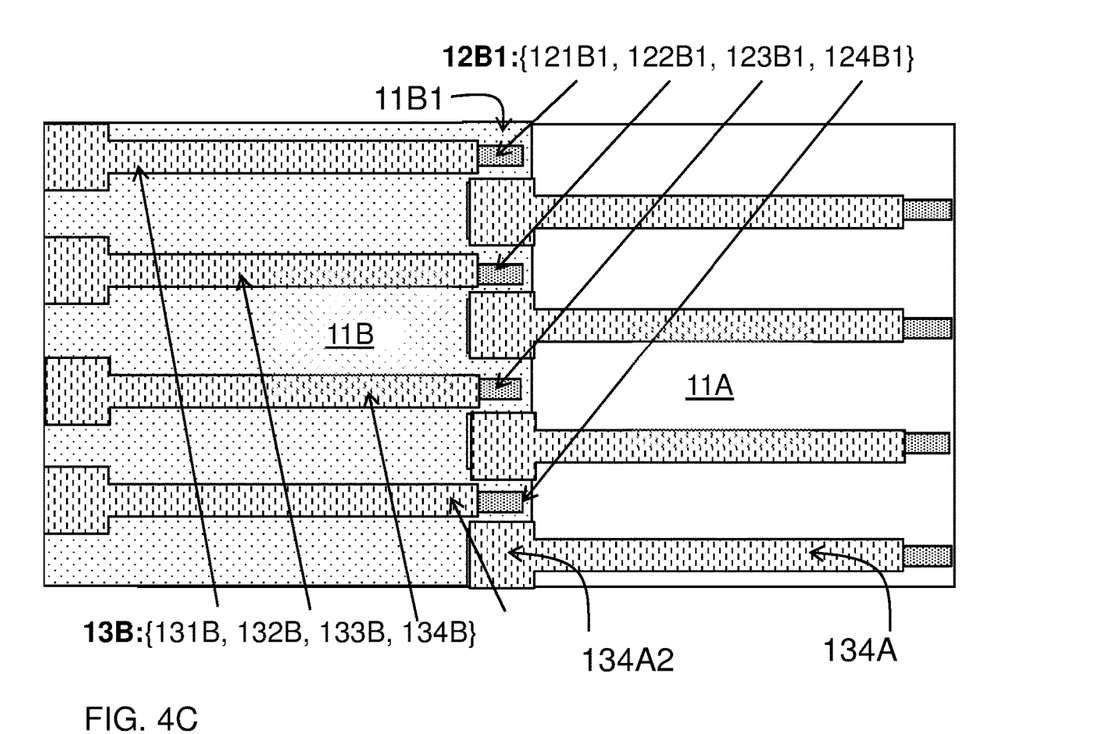

The layer of insulating material that covers the electrical conductors has a widened end portion that not only covers the electrical conductor, but also the end portion of the transparent electrode layer region where the latter is interdigitated with the subsequent transparent layer region. For example as shown in FIG. 4C, the insulating layer portion 134A has a widened end portion 134A2 that covers an end portion 11A4 of the first transparent electrode layer region.

Figure 4D:
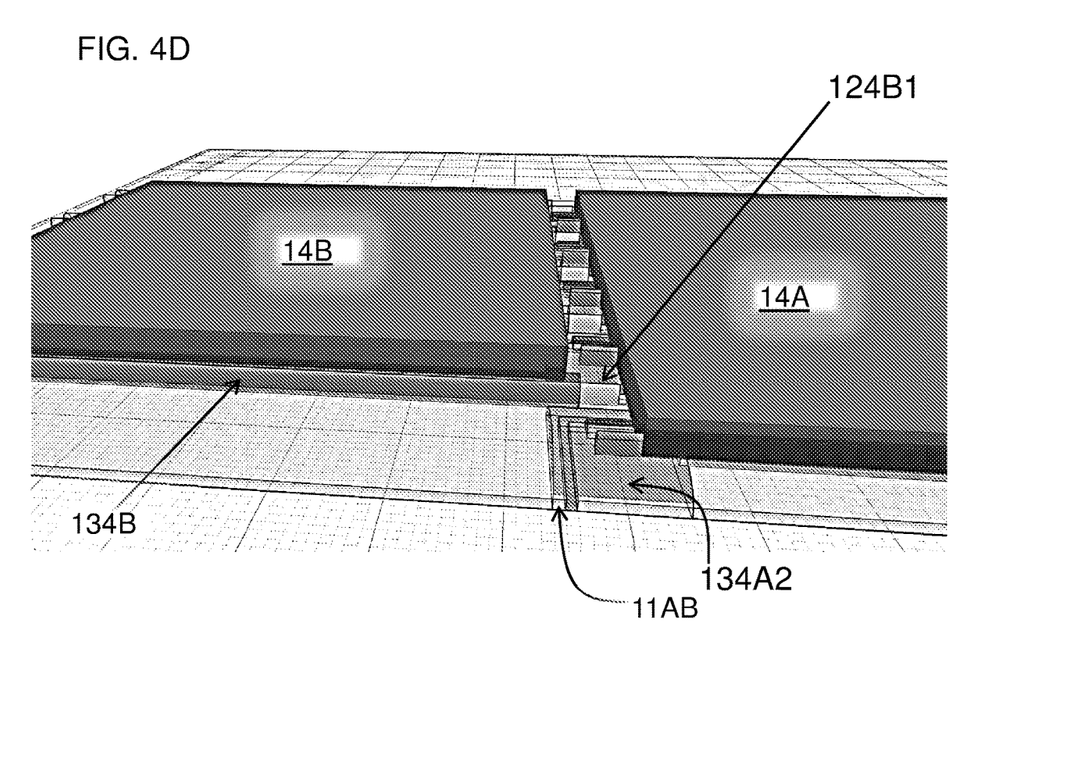

As shown in FIG. 4D, photo-voltaic layer portions 14A, 14B are deposited that extend over corresponding transparent electrode region 11A, 11B and over the insulated portion of the one or more conductors of a corresponding set.

Figure 4E:
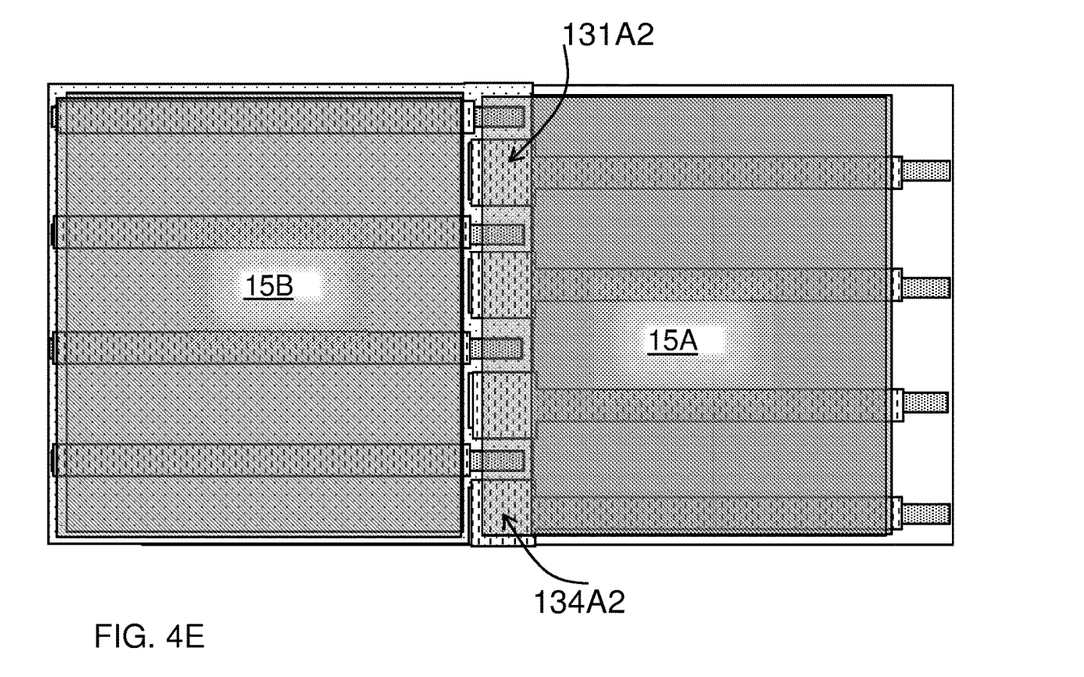
FIG. 4E shows an embodiment of a photovoltaic device as claimed which is obtained in the last step of the third embodiment of the method. In each of FIG. 4A-4E the top part shows a top-view of the semi-finished product obtained in a step of the method, and the bottom part shows that semi-finished product from a perspective view.

In a subsequent step, as shown in FIG. 4E, further electrode regions 15A, 15B are deposited that extend over a corresponding photovoltaic layer region. The further electrode region 15A also extends over the electric contacts formed by the exposed ends of the set 12B of one or more electrical conductors of a next photo-voltaic device cell if present.

The invention claimed is:

1. A photovoltaic device comprising at least a serially interconnected first photovoltaic device cell and second photovoltaic device cell that succeeds the first photovoltaic device cell in a succession direction and that is electrically connected in series therewith, wherein each photovoltaic device cell, of the first and second photovoltaic device cells, comprises:

a respective transparent electrode layer region, wherein each transparent electrode layer region of the first and second photovoltaic device cells, is distinct from another respective transparent electrode layer region in said succession direction;

a respective set of one or more electrical conductors arranged on a surface of each transparent electrode region, the electrical conductors having a first main surface forming an electrical contact with the respective transparent electrode region, and having a second main surface opposite the first main surface, wherein the second main surface has an exposed end-portion forming a further electrical contact in a direction away from the succession direction, a remaining portion of the second main surface being electrically insulated, a respective photovoltaic stack portion, each photovoltaic stack portion extending over the respective transparent electrode region and over the electrically insulated portion of the one or more conductors of the respective set of one or more electrical conductors, a respective further electrode region that extends over the respective photovoltaic stack portion, wherein the respective further electrode region of the at least a first photovoltaic device cell extends over the electrical contacts formed by the exposed ends of the set of one or more electrical conductors of the at least a second photovoltaic device cell.

2. The photovoltaic device according to claim 1, wherein the exposed ends of the set of one or more electrical conductors of the at least a second photovoltaic device cell extend over the remaining, electrically insulated portion of the second main surface of a respective one of the one or more electrical conductors of the at least a first photovoltaic device cell.

3. The photovoltaic device according to claim 1, wherein the set of one or more electrical conductors of the at least a first photovoltaic device cell extend in the succession direction beyond the exposed ends of the set of one or more electrical conductors of the at least a second photovoltaic device cell, each of the one or more electrical conductors of the at least a first photovoltaic device cell being displaced in a direction transverse to the succession direction with respect to each of the one or more electrical conductors of the at least a second photovoltaic device cell.

4. The photovoltaic device according to claim 3, wherein the respective transparent electrode layer regions of the first and the second photovoltaic device cell have a jagged boundary wherein end portions of the transparent electrode layer regions of the first and the second photovoltaic device cell are mutually, and wherein the one or more electrical conductors extend with their exposed end portions over the end portions of the transparent electrode layer regions the second photovoltaic device cell.

5. A method of manufacturing a photovoltaic device comprising at least a serially interconnected first photovoltaic device cell and second photovoltaic device cell, which succeed each other in a succession direction, the method comprising:

providing a transparent electrode layer having, for the first and second photovoltaic device cells, respective transparent electrode layer regions, which are distinct from each other in said succession direction;

forming a respective set of one or more electrical conductors on a surface of each transparent electrode region, the electrical conductors having a first main surface forming an electric contact with their respective transparent electrode region, and having a second main surface opposite the first main surface, wherein the second main surface has an exposed end-portion forming a further electrical contact in a direction away from the succession direction, a remaining portion of the second main surface being electrically insulated;

depositing respective photovoltaic layer regions, each photovoltaic layer region extending over the respective transparent electrode region and over the insulated portion of the one or more conductors of the respective set; and depositing respective further electrode regions for each photovoltaic device cell that extends over the respective photovoltaic layer regions, wherein the further electrode region that extends over the respective photovoltaic layer region of the first photovoltaic device cell also extends over the electrical contacts formed by the exposed ends of the set of one or more electrical conductors that are formed on the respective transparent electrode layer region of the second photovoltaic device cell.

6. The method according to claim 5, wherein forming a respective set comprises:

a first sub-step of depositing an electrically conducting material on the surface of the transparent electrode to form the set of one or more electrical conductors having a first main surface forming an electrical contact with a respective first, transparent electrode region, and having a second main surface opposite said first main surface, and a second sub-step of depositing a respective electrically insulating layer over a remaining portion of the second main surface of each of the one or more electrical conductors therewith leaving exposed end-portions of the transparent electrode.

7. The method according to claim 5, wherein forming a respective set comprises:

a first sub-step of depositing a precursor for an electrically conductive material on the surface of the transparent electrode, an intermediate sub-step of curing the precursor to form the set of one or more electrical conductors having a first main surface forming an electrical contact with a respective transparent electrode region, and having a second main surface opposite said first main surface, and a second sub-step of depositing an electrically insulating material over a remaining portion of the second main surface therewith leaving exposed end-portion of the transparent electrode to form the further electrical contact.

8. The method according to claim 5, wherein electrical conductors in a set of electrical conductors of a photovoltaic portion are aligned with electrical conductors in a set of electrical conductors of an immediately succeeding photovoltaic portion.

9. The method according to claim 5, wherein a photovoltaic layer region is formed as a stack of sub layers, and at least comprises a photovoltaic sub layer.

10. The method according to claim 5, wherein a photovoltaic layer region is formed as a stack of sub layers, and a photovoltaic sub layer that includes one or more layers taken from the group consisting of: an electron injection layer, an electron transport layer, a hole injection layer and a hole transport layer.

11. The method according to claim 5, wherein providing a transparent electrode layer having respective transparent electrode layer regions, which are distinct from each other in said succession direction, comprises:

depositing a continuous transparent electrode layer of a transparent electrically conductive material, and subsequently ablating transparent electrically conductive material of the continuous transparent electrode layer along a boundary to be formed between the transparent electrode region of the first photovoltaic device and of the second photovoltaic device cell.

12. The method according to claim 11, wherein the boundary to be formed is jagged, so that end portions of the transparent electrode layer regions of the first and the second photovoltaic device cell are mutually interdigitated.

13. The method according to claim 12, comprising:

depositing the one or more electrical conductors over the end portions of the transparent electrode layer regions of the second photovoltaic device cell, and during depositing a respective electrically insulating layer, leaving free an end portion of the one or more electrical conductors at a side extending over the end portions of the transparent electrode layer regions.

\* \* \* \* \*